(12) United States Patent
Levinson

(10) Patent No.: US 7,061,578 B2
(45) Date of Patent: Jun. 13, 2006

(54) METHOD AND APPARATUS FOR MONITORING AND CONTROLLING IMAGING IN IMMERSION LITHOGRAPHY SYSTEMS

(75) Inventor: Harry J. Levinson, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 135 days.

(21) Appl. No.: 10/638,927

(22) Filed: Aug. 11, 2003

(65) Prior Publication Data
US 2005/0037269 A1    Feb. 17, 2005

(51) Int. Cl.
G03B 27/42    (2006.01)
G03B 27/52    (2006.01)

(52) U.S. Cl. .......................................... 355/53; 355/30
(58) Field of Classification Search .................. 355/30, 355/53–55, 77; 359/380; 356/237
See application file for complete search history.

(56) References Cited

U.S. PATENT DOCUMENTS

| | | | |
|---|---|---|---|
| 4,346,164 A | | 8/1982 | Tabarelli et al. |
| 4,480,910 A | * | 11/1984 | Takanashi et al. ............ 355/30 |
| 4,569,590 A | | 2/1986 | Karny et al. |
| 4,670,637 A | | 6/1987 | Morrison et al. |
| 5,151,752 A | | 9/1992 | Oono et al. |
| 5,422,714 A | | 6/1995 | Fladd |
| 5,610,683 A | * | 3/1997 | Takahashi .................... 355/53 |
| 5,825,043 A | * | 10/1998 | Suwa .......................... 250/548 |
| 5,870,189 A | * | 2/1999 | Uesugi et al. ............... 356/335 |
| 6,133,995 A | * | 10/2000 | Kubota ......................... 356/73 |
| 6,241,827 B1 | * | 6/2001 | Tanaka et al. ................. 134/18 |
| 6,576,559 B1 | * | 6/2003 | Nakata et al. .............. 438/706 |
| 2002/0163629 A1 | | 11/2002 | Switkes et al. |

FOREIGN PATENT DOCUMENTS

| | | |
|---|---|---|
| EP | 0 605 103 | 7/1994 |
| EP | 0 657 713 | 6/1995 |
| EP | 1 486 827 | 12/2004 |
| EP | 1 489 461 | 12/2004 |
| WO | WO 99/01797 | 1/1999 |
| WO | WO 01/88506 | 11/2001 |
| WO | WO 02/091078 | 11/2002 |
| WO | WO 2005/006026 | 1/2005 |

OTHER PUBLICATIONS

International Search Report and Written Opinion for PCT/US2004/023876 dated Jul. 6, 2005.
International Search Report and Written Opinion for PCT/US2004/023875 dated Jul. 6, 2005.
International Search Report and Written Opinion for PCT/US2004/028371 dated Jul. 6, 2005.

* cited by examiner

*Primary Examiner*—Henry Hung Nguyen
(74) *Attorney, Agent, or Firm*—Renner, Otto, Boisselle & Sklar, LLP

(57) ABSTRACT

A method of monitoring an immersion lithography system in which a wafer can be immersed in a liquid immersion medium for exposure by an exposure pattern. The method detects the presence of a foreign body in the immersion medium to thereby determine if the immersion medium in a state that is acceptable for exposing the wafer with the exposure pattern. Also disclosed is a monitoring and control system for an immersion lithography system.

22 Claims, 1 Drawing Sheet

METHOD AND APPARATUS FOR MONITORING AND CONTROLLING IMAGING IN IMMERSION LITHOGRAPHY SYSTEMS

TECHNICAL FIELD

The present invention relates generally to the field of integrated circuit manufacture and, more particularly, to a method and apparatus for monitoring and/or controlling imaging of a wafer by immersion lithography.

BACKGROUND

The formation of various integrated circuit (IC) structures on a wafer often relies on lithographic processes, sometimes referred to as photolithography. For instance, patterns can be formed from a photo resist (PR) layer by passing light energy through a mask (or reticle) having an arrangement to image the desired pattern onto the PR layer. As a result, the pattern is transferred to the PR layer. In areas where the PR is sufficiently exposed and after a development cycle, the PR material can become soluble such that it can be removed to selectively expose an underlying layer (e.g., a semiconductor layer, a metal or metal containing layer, a dielectric layer, etc.). Portions of the PR layer not exposed to a threshold amount of light energy will not be removed and serve to protect the underlying layer. The exposed portions of the underlying layer can then be etched (e.g., by using a chemical wet etch or a dry reactive ion etch (RIE)) such that the pattern formed from the PR layer is transferred to the underlying layer. Alternatively, the PR layer can be used to block dopant implantation into the protected portions of the underlying layer or to retard reaction of the protected portions of the underlying layer. Thereafter, the remaining portions of the PR layer can be stripped.

There is a pervasive trend in the art of IC fabrication to increase the density with which various structures are arranged. As a result, there is a corresponding need to increase the resolution capability of lithography systems. One promising alternative to conventional optical lithography is a next-generation lithographic technique known as immersion lithography. In immersion lithography, the wafer to imaged by a lithography system is placed in a liquid medium, through which the patterned light is transmitted. The immersion medium replaces an air gap that is conventionally present between the final lens of a conventional dry lithography imaging system and the wafer.

However, attempts to implement immersion lithography have encountered a number of challenges. For example, a foreign body (or multiple foreign bodies) disposed in the immersion medium can adversely effect the quality of the exposure pattern incident on the wafer.

Accordingly, there exists a need in the art for improved immersion lithography systems and associated methods of controlling imaging using immersion lithography systems.

SUMMARY OF THE INVENTION

According to one aspect of the invention, the invention is directed to a method of monitoring an immersion lithography system. The method can include immersing a wafer to be exposed in a liquid immersion medium; directing a laser beam through a volume of the immersion medium through which an exposure pattern is configured to traverse; and determining if a portion of the laser beam beyond a predetermined threshold value becomes scattered, thereby indicating that a foreign body is present in the traversal volume and the immersion medium is in a state that is unacceptable for exposing the wafer with the exposure pattern.

According to another aspect of the invention, the invention is directed to a monitoring and control system for an immersion lithography system. The immersion lithography system can include, for example, a chamber for receiving a wafer to be exposed and immersing the wafer in an immersion medium and an imaging subsystem for directing an exposure pattern towards the wafer and through the immersion medium. The monitoring and control system includes an immersion medium monitoring subsystem including a laser for directing a laser beam through a volume of the immersion medium through which the exposure pattern is configured to traverse, and a detector assembly for receiving the laser beam after the laser beam exits the traversal volume and for outputting a signal containing information indicative of the presence or absence of a foreign body in the immersion medium; and a controller, the controller receiving and analyzing the signal to determine if the immersion medium is in a state that is acceptable for exposing the wafer with the exposure pattern.

BRIEF DESCRIPTION OF DRAWINGS

These and further features of the present invention will be apparent with reference to the following description and drawings, wherein.

DISCLOSURE OF INVENTION

Figure 1:
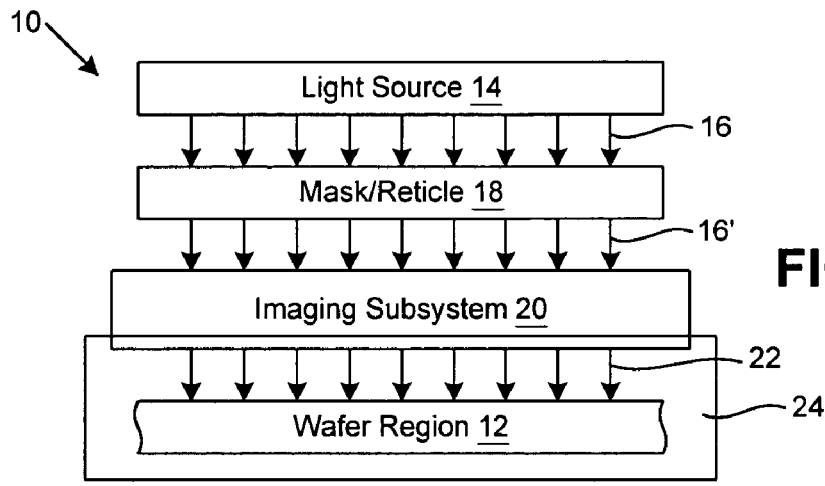
FIG. 1 is a schematic block diagram of a exemplary integrated circuit processing arrangement.

In the detailed description that follows, some corresponding components have been given the same reference numerals, regardless of whether they are shown in different embodiments of the present invention. To illustrate the present invention in a clear and concise manner, the drawings may not necessarily be to scale and certain features may be shown in somewhat schematic form.

The description herein is presented in the exemplary context of fabricating a wafer having an integrated circuit (IC) formed thereon. Example ICs include general purpose microprocessors made from thousands or millions of transistors, a flash memory array or any other dedicated circuitry. However, one skilled in the art will appreciate that the methods and devices described herein can also be applied to the fabrication of any article manufactured using lithography, such as micromachines, disk drive heads, gene chips, micro electromechanical systems (MEMS) and so forth.

The apparatus and methods described herein can provide for real-time detection of a key parameter for immersion lithography. Namely, the presence or absence of a foreign body (or multiple foreign bodies) can be monitored to determine if conditions are favorable for exposing a wafer. Foreign bodies can include, for example, a particle such as an item suspended in the immersion medium 24. Example particles include, but are not limited dust, a contaminant, a stray piece of photo resist, and so forth. Foreign bodies can also include a bubble, such as an air pocket or other gas pocket disposed in the immersion medium 24. A foreign body can also be a particle with a bubble adhered to the particle. Even very small foreign bodies can interfere with the immersion lithography process. Therefore, the detection apparatus described herein can be configured to detect foreign bodies in the immersion medium having a size of about 50 nm across to about several microns across.

Referring to FIG. 1, illustrated is a schematic block diagram of an exemplary IC processing arrangement that includes an immersion lithography system 10 used to image a pattern onto a wafer 12, or a region thereof. The system 10 can be, for example, a step-and-repeat exposure system or a step-and-scan exposure system, but is not limited to these example systems. The system 10 can include a light source 14 for directing light energy 16 towards a mask 18 (sometimes referred to as a reticle). The light energy 16 can have, for example, a deep ultraviolet (DUV) wavelength (e.g., about 248 nm or about 193 nm) or a vacuum ultraviolet (VUV) wavelength (e.g., about 157 nm).

The mask 18 selectively blocks light energy 16 such that a light energy pattern 16' defined by the mask 18 is transferred towards the wafer 12. An imaging subsystem 20, such as a stepper assembly or a scanner assembly, sequentially directs the energy pattern 16' transmitted by the mask 18 to a series of desired locations on the wafer 12. The imaging subsystem 20 may include a series of lenses and/or reflectors for use in scaling and directing the energy pattern 16' towards the wafer 12 in the form of an imaging (or exposure) light energy pattern 22.

The imaging pattern 22 (or exposure pattern) is transmitted by the imaging subsystem 20 through an immersion fluid, or immersion medium 24, that has a relatively high index of refraction (e.g., an index of refraction greater than 1). The immersion medium 24 can be a liquid. In one example, purified de-ionized water can be used in conjunction with a 193 nm light source 14 (e.g., an argon fluorine (ArF) laser). In another example, polyfluoroethers can be used in conjunction with a 157 nm light source 14.

Figure 2:
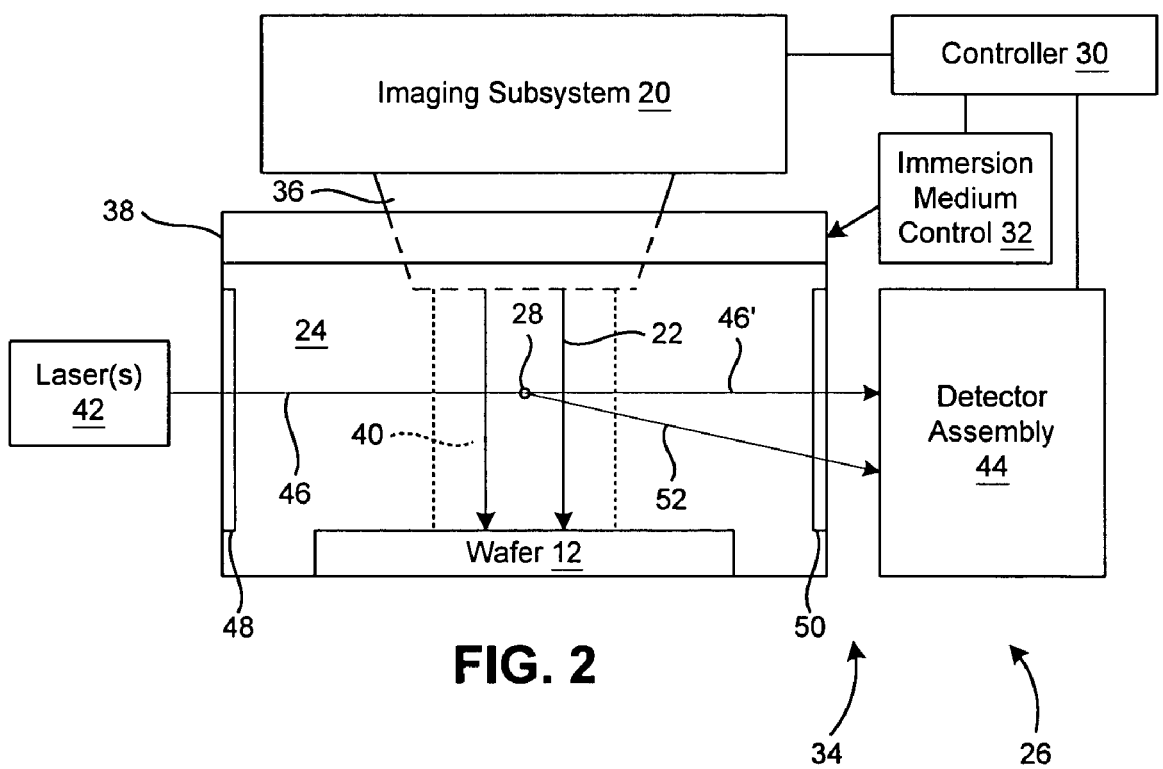
FIG. 2 is a schematic block diagram of an immersion medium monitoring and control assembly for the exemplary integrated circuit processing arrangement.

With additional reference to FIG. 2, shown is a schematic block diagram of an immersion medium monitoring and control assembly 26 for use with the exemplary IC processing arrangement 10. As will be understood by those with ordinary skill in the art, the presence of a foreign body 28 in the immersion medium 24 can have a detrimental effect on the imaging pattern 22 output by the imaging subsystem 20 and incident on the wafer 12. For instance, the presence of one or more foreign bodies 28 can lead to defects in the integrated circuit being fabricated on the wafer 12.

Without intending to be bound by theory, the reasons for the presence of foreign bodies 28 may vary widely. For example, turbulence in the immersion medium 24 may cause bubbles to form and/or become submersed in the immersion medium 24. One source of turbulence can be the movement of a stage (not shown) upon which the wafer 12 may be mounted and moved relative to the imaging subsystem 20. For example, the wafer 12 may be exposed, then moved about 30 mm to a new location and stopped for a second exposure and so forth. Wafer motion rates can be about 250 mm/second to about 500 mm/second. This movement may create turbulence or other changes to the properties of the immersion medium 24 that could result in the presence of foreign bodies. In addition, it is contemplated that the immersion medium 24 may be purposefully placed in motion (e.g., in a flow pattern over the wafer 12) or subjected to hydraulic pressure. During exposure, gases may be generated in the photoresist. These gases could dissolve in the immersion fluid, ultimately leading to bubble formation. It is also contemplated that a foreign body 28 may be carried on the wafer and brought into the immersion medium 24 where the foreign body 28 dislodges from the wafer 12 and begins to "float" in the immersion medium 24.

Therefore, it is desirable to monitor the immersion medium 24 for the presence of foreign bodies 28 and control the immersion medium 24 should the presence of a foreign body 28 be detected. Accordingly, the assembly 26 can include a controller 30, such as a computer programmed to control the IC processing arrangement 10 and an immersion medium control subsystem 32. The controller 30 can receive an input signal or signals from an immersion medium monitoring subsystem 34.

As indicated, the imaging subsystem 20 can include an output lens 36, or other final optical structure. At least a portion of the imaging subsystem 20, including the lens 36, can enter a chamber 38 containing the immersion medium 24 and the wafer 12. The lens 36 will be in intimate contact with the immersion medium 24 such that the imaging pattern 22 output by the lens 36 is projected through the immersion medium 24 and is incident onto at least a portion of the wafer 12, which is disposed or immersed in the immersion medium 24.

The volume of immersion medium 24 in the exposure field of the imaging pattern 22 (e.g., the volume or portion of the immersion medium 24 through which the imaging pattern 22 traverses) will be referred to herein as the traversed volume 40. In one embodiment, the lens 36 can be disposed about 1 mm above the wafer 12. However, the distance between the lens 36 and wafer 12 may vary depending on the illumination wavelength, the immersion medium 24, the specific processing arrangement 10, the devices being fabricated on the wafer 12, the particular photo resist employed, an so forth. In some arrangements, the traversal volume can be about 25 mm wide and 10 mm long, although these parameters can vary widely.

The monitoring subsystem 34 includes devices to monitor the immersion medium 24 or a portion thereof, such as the traversal volume 40 portion of the immersion medium 24, for the presence of a foreign body 28. The monitoring subsystem 34 can include, for example, a laser beam source 42 and a detector assembly 44. The detector assembly 44 can be implemented with, for example, a photomultiplier tube. In one embodiment, a beam 46 generated by the laser 42 is several hundred microns in diameter. Therefore, multiple beams 46 produced by one or more lasers 42 can be used to simultaneously monitor the immersion medium 24 throughout the entire volume of the traversal volume 40. If needed, additional detector assemblies 44 can be added. For simplicity, the monitoring associated with only one beam 46 is shown and described. However, implementing a multiple beam system should be apparent to one of ordinary skill in the art. In an alternative embodiment, one or more beams 46 can be scanned through the traversal volume 40 to monitor the immersion medium 24 throughout the traversal volume 40.

The laser 42 should be selected to generate an output wavelength to avoid activation of the photo resist disposed on the wafer 12. For example, the wavelength should be about 300 nm or above (e.g., in the visible spectrum), but this parameter can vary depending on the properties of the photo resist used. In one embodiment, a helium neon (HeNe) laser can be used.

The chamber 36 can include an entrance window 48 through which the beam 46 generated by the laser 42 enters the chamber 38 and an exit window 50 through which the beam exits the chamber 38. The windows 48, 50 should be transmissive of the wavelength of the beam 46 generated by the laser 40 and can include an anti-reflective coating or other mechanism for facilitating beam 46 transmission.

If the beam 46 does not encounter a foreign body 28, the beam 46 will substantially pass directly through the immersion medium 24. As a result, the beam 46 will be incident on the detector assembly 44 in a predicable location and/or with a predictable intensity. A signal indicative of the location and/or intensity of the beam 46 can be generated and output by the detector assembly 44. The signal output by the detector assembly 44 can be received by the controller 30. In one embodiment, the controller 30 is programmed to analyze the signal received from the detector assembly 44. If the controller 30 determines that the beam 46 did not encounter a foreign body 28, then it can be concluded that favorable conditions exist to expose the wafer 12. Accordingly, the controller 30 can be programmed to send control commands to the processing arrangement 10 to expose the wafer 12.

In the situation where the beam 46 does encounter a foreign body 28, a majority of the beam 46 may pass directly through the immersion medium 24 and become incident on the detector assembly 44. However, in some cases, the beam incident on the detector assembly 44 will be a diminished beam 46' (e.g., having a location that is different than expected and/or an intensity that is less than expected).

Also, in the presence of a foreign body 28, a portion of the beam 46 can become scattered to form a scattered light segment 52. The detector assembly 44 can be configured to detect the scattered light segment 52 and/or the diminished beam 46'. Upon detection of the scattered light segment 52 and/or the diminished beam 46', the detector assembly 44 can be configured to generate a signal containing information indicating that a foreign body 28 disrupted the beam 46. The information can include data concerning the location and intensity of the detected scattered light segment 50 and/or the location and intensity of the diminished beam 46'.

The signal can be received by the controller 30, which, in turn, is programmed to process the signal. In one example, the controller 30 can determine if the scattered light segment 52 contains an amount of light below a threshold amount (e.g., indicating the absence of a foreign body 28) or above the threshold amount (e.g., indicating the presence of a foreign body 28). In another example, the presence or absence of a foreign body 28 can be determined by comparing information relating to the beam 46 or the diminished beam 46' as incident on the detector assembly 44 (e.g., location and/or intensity values) against expect results. In yet another example, a combination of information from the scattered light segment 52 and/or the beam 46 (or diminished beam 46') can be used to monitor for the presence or absence of a foreign body 28.

Should the processing by the controller 30 be consistent with the identification of foreign body 28 within at least the traversal volume 40, the controller 30 can be programmed to defer exposure of the wafer 12 since conditions within the immersion medium 24 are likely to be unfavorable to achieving a satisfactory exposure of the wafer 12.

As indicated, multiple beams can be used to monitor for the presence of a foreign body 28 (or bodies) at multiple locations of the traversal volume 40, if not all of the traversal volume 40. Alternative, one or more beams can be scanned across the traversal volume 40 to monitor for the presence of a foreign body 28 (or bodies) at multiple locations of the traversal volume 40, if not all of the traversal volume 38. In these embodiments, the detector assembly 44 (or assemblies) can be configured to generate a composite signal or multiple signals to the controller 30.

In one embodiment, measurement(s) of light by the detector assembly, or raw data from the monitoring subsystem 34 from which foreign body 28 detection can be ascertained, can be transmitted from the detector assembly 44 to the controller 30 in the form of an input signal or signals. The controller 30 can process the input signal(s) to determine if a foreign body 28 is present at any location in the traversal volume 40.

If no foreign body 28 is detected, the controller 30 can issue commands to the system 10 to expose the wafer 12. However, if a foreign body 28 is detected, then it can be concluded that conditions are not favorable for exposing the wafer 12 and the controller 30 be programmed to defer exposing the wafer. In the latter case (e.g., when a foreign body 28 is detected), the controller 30 can be programmed to carry out one or more specified actions. For example, the controller 28 can be programmed to simply wait for a predetermined period of time during which it is expected that the foreign body 28 will move out of the traversal volume 40. After the predetermined period, the immersion medium monitoring subsystem 34 can be controlled to retest for the presence of a foreign body 28. In another example, the controller 30 be programmed to take a corrective action. Example correction actions can include sending commands to the immersion medium control subsystem 32, such as commands to decrease or increase an immersion medium 24 flow rate, to increase the pressure of the immersion medium 24 (e.g., in an attempt to force out or dissolve the foreign body 28), and so forth. In another example, the controller 30 can be programmed to alert an operator to the unfavorable environment for imaging the wafer 12. Alerting an operator may be reserved for situations where repeated measurements of the immersion medium 24 have revealed the presence of a foreign body 28. In yet another example, the controller 30 can be programmed to perform more than one of the foregoing functions, such as waiting a predetermined period of time and taking a corrective action.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of monitoring an immersion lithography system, comprising:
   immersing at least a portion of a wafer to be exposed in a liquid immersion medium;
   directing a laser beam through a volume of the immersion medium through which an exposure pattern is configured to traverse; and
   determining if a portion of the laser beam beyond a predetermined threshold value becomes scattered, thereby indicating that a foreign body is present in the traversal volume and the immersion medium is in a state that is unacceptable for exposing the wafer with the exposure pattern.

2. The method according to claim 1, further comprising exposing the wafer with the exposure pattern if the determining indicates that a scattered portion of the laser beam is less than the predetermined threshold value.

3. The method according to claim 1, wherein the determining is carded out by detecting scattered light segment separated from the laser beam by an encounter of the laser beam with a foreign body and analyzing information relating to the detected scattered light segment.

4. The method according to claim 3, wherein the information relating to the detected scattered light segment is at least one of an intensity of the scattered light segment or a location of the scattered light segment.

5. The method according to claim 1, wherein the determining is carried out by detecting the laser beam after the laser beam exits the traversal volume and analyzing information relating to the detected laser beam to determine if the laser beam encountered a foreign body and became diminished.

6. The method according to claim 5, wherein the information relating to the laser beam is indicative of an encountered foreign body if at least one of an intensity of the laser beam incident on a detecting assembly is less than expected or a location of the laser beam incident on detecting assembly is different than expected.

7. The method according to claim 1, wherein the entire traversal volume is monitored for the presence of the foreign body.

8. The method according to claim 7, wherein multiple laser beams are used to monitor for the presence of the foreign body.

9. The method according to claim 7, wherein at least one laser beam is scanned through the traversal volume to monitor for the presence of the foreign body.

10. The method according to claim 1, further comprising controlling the immersion lithography system to defer exposing the wafer if the immersion medium is in the state that is unacceptable for exposing the wafer with the exposure pattern.

11. The method according to claim 10, wherein the immersion lithography system is controlled to wait a predetermined period of time and repeat the directing and determining if the immersion medium is in the state that is unacceptable for exposing the wafer with the exposure pattern.

12. The method according to claim 10, wherein an immersion medium control subsystem is commanded to take corrective action if the immersion medium is in the state that is unacceptable for exposing the wafer with the exposure pattern.

13. The method according to claim 1, wherein the foreign body is at least one of a particle or a bubble.

14. A monitoring and control system for an immersion lithography system, the immersion lithography system including a chamber for receiving a wafer to be exposed and immersing at least a portion of the wafer in an immersion medium and an imaging subsystem for directing an exposure pattern towards the wafer and through the immersion medium, comprising:
an immersion medium monitoring subsystem including a laser for directing a laser beam through a volume of the immersion medium through which the exposure pattern is configured to traverse, and a detector assembly for receiving the laser beam after the laser beam exits the traversal volume and for outputting a signal containing information indicative of the presence or absence of a foreign body in the immersion medium; and
a controller, the controller receiving and analyzing the signal to determine if the immersion medium is in a state that is acceptable for exposing the wafer with the exposure pattern.

15. The monitoring and control system according to claim 14, wherein the controller controls the immersion lithography system to expose the wafer with the exposure pattern if the determining indicates that a scattered portion of the laser beam is less than the predetermined threshold value.

16. The monitoring and control system according to claim 14, wherein the determining is carried out by detecting a scattered light segment separated from the laser beam by an encounter of the laser beam with a foreign body and analyzing information relating to the scattered light segment.

17. The monitoring and control system according to claim 16, wherein the information relating to the detected scattered light segment is at least one of an from intensity of the scattered light segment or a location of the scattered light segment.

18. The monitoring and control system according to claim 14, wherein the determining is carried out by detecting the laser beam after the laser beam exits the traversal volume and analyzing information relating to the detected laser beam to determine if the laser beam encountered a foreign body and became diminished.

19. The monitoring and control system according to claim 18, wherein information relating to the laser beam is indicative of an encountered foreign body if at least one of an intensity of the laser beam incident on the detector assembly is less than expected or a location of the laser beam incident on the detector assembly is different than expected.

20. The monitoring and control system according to claim 14, wherein the controller controls the immersion lithography system to defer exposing the wafer if the immersion medium is in the state that is unacceptable for exposing the water with the exposure pattern.

21. The method according to claim 1, wherein the determining is conducted to monitor specifically for one or more bubbles present in the traversal volume.

22. The monitoring and control system according to claim 14, wherein the immersion medium monitoring subsystem and the controller are coordinated with each other to monitor specifically for one or more bubbles present in the traversal volume.

* * * * *

UNITED STATES PATENT AND TRADEMARK OFFICE
CERTIFICATE OF CORRECTION

PATENT NO. : 7,061,578 B2
APPLICATION NO. : 10/638927
DATED : June 13, 2006
INVENTOR(S) : Harry J. Levinson It is certified that error appears in the above-identified patent and that said Letters Patent is hereby corrected as shown below:

Claim 3, line 2, replace "is carded out by detecting scattered" with --is carried out by detecting a scattered--.
Claim 6, line 5, replace "on detecting" with --on the detecting--.
Claim 17, line 3, replace "an from intensity" with --an intensity--.
Claim 19, line 2, replace "wherein information" with --wherein the information--.
Claim 20, line 5, replace "water with" with --wafer with--.

Signed and Sealed this

Fifteenth Day of August, 2006

JON W. DUDAS
*Director of the United States Patent and Trademark Office*